United States Patent [19]

Bowers

[11] 4,193,122

[45] Mar. 11, 1980

[54] CONNECTING LINE GENERATOR

[75] Inventor: John J. Bowers, Medina, Ohio

[73] Assignee: Gould Inc., Rolling Meadows, Ill.

[21] Appl. No.: 855,128

[22] Filed: Nov. 28, 1977

[51] Int. Cl.² .................... G06F 3/14; G08B 23/00
[52] U.S. Cl. .................................. 364/900; 340/722; 340/728
[58] Field of Search ................ 340/324 AD, 722, 728, 340/747; 364/520, 521, 723, 900 MS File, 200 MS File; 346/110 R

[56] References Cited

U.S. PATENT DOCUMENTS

| | | | |
|---|---|---|---|
| 3,430,207 | 2/1969 | Davis | 364/900 |
| 3,605,109 | 9/1971 | Tyler | 346/110 |
| 3,648,270 | 3/1972 | Metz | 340/324 AD |
| 3,778,811 | 12/1973 | Gicca | 340/324 AD |
| 3,781,850 | 12/1973 | Gicca | 340/324 AD |
| 3,786,478 | 1/1974 | King, Jr. | 340/324 AD |
| 3,911,404 | 10/1975 | O'Neill, Jr. | 364/900 |
| 4,038,668 | 7/1977 | Quarton | 364/521 |
| 4,068,310 | 1/1978 | Friauf | 340/324 AD |
| 4,074,281 | 2/1978 | Quarton | 364/723 |

*Primary Examiner*—James D. Thomas
*Attorney, Agent, or Firm*—Thomas E. Kocovsky, Jr.; Charles E. Snee, III; Russell E. Baumann

[57] ABSTRACT

A circuit for interpolating discrete data points or horizontal line segments of a single valued function in one direction into a continuous line display. So that only one value need be produced from a memory for each display position along one axis of an x,y coordinate system display, the circuit generates lines parallel to the other axis which connect the display at adjacent positions along the first axis. The circuit receives and displays a line of data; delays the line of data by one clock pulse and displays the delayed line; compares the line and delayed line to determine the ends of data in the line; stores the position of the ends of data in a shift register; displays the output of the shift register; and returns the output of the shift register to the input of the shift register for each end position until data is received in a position adjacent the end position.

8 Claims, 8 Drawing Figures

CONNECTING LINE GENERATOR

CROSS REFERENCE TO RELATED APPLICATIONS

This application is related to the following commonly assigned application filed concurrently herewith:

Ser. No. 855,522 entitled RISE AND FALL LINE INSERTION CIRCUITRY, filed in the name of Thomas Harold Lecklider.

BACKGROUND OF THE INVENTION

In a typical raster scan type cathode ray tube, an image is generated by allowing a scanning electron beam to strike the phosphor on the face of a cathode ray tube only at selected locations and by blanking or keeping off the electron beam as it scans over all other locations. To maintain an image generated in this manner on the cathode ray tube, it is necessary for the electron beam continuously to repeat scanning the same data. To allow this repeated scanning, the data is normally stored in a memory. In the past, the memory in order to be able to address any point on the face of the cathode ray tube had to contain M storage positions where M is equal to the number of scan lines per frame times the number of elements of resolution in one scan line. A display, for example, of 240 visible scan lines and 256 resolvable elements per scan line would require 240×256 or 61,440 addressable storage elements. If the beam is to be just on or off at each location, the storage elements are only required to be single bit memories.

The present invention has found that in the special case of a display of a wave form which is single valued in one direction, e.g. perpendicular to the scan line, the number of storage positions need only be equal to the number of resolvable elements in one scan line. Each storage position must be large enough to indicate which scan line the display at the resolvable element it represents is to appear. In the example given above of 240 visible scan lines and 256 resolvable elements, 256 storage positions would be required. Each of the storage positions would have to be able to address any one of the 240 lines. This is to say, each storage position must have the ability to take any one of 240 different values. In the case of a solid state memory made up of memory bits, each bit having two states, each memory position must have N memory bits where $2^N \geq$ number of scan lines. To be able to address 240 different scan lines eight memory bits are needed. Thus, 256 memory positions, each with eight bits, uses 2,048 bits of memory as opposed to the 61,440 bits used in a 256×240 bit matrix memory. Of course, the present invention applies to displays of any size.

If there is only one storage position for each position on the raster scan lines, then the data at that position can be displayed on only one scan line. Such a display on a cathode ray tube would appear as a series of disjointed points of horizontal line segments, vertical lines could not be displayed. The present invention, without increasing the amount of memory required, generates vertical lines to connect each of the points or horizontal line segments. Thus, the present invention allows any single valued function such as sine wave, series of step functions, exponential, to be stored as discrete points or horizontal line segments, yet be displayed as a continuous function.

The present invention can supply vertical connecting lines, i.e. interpolate, between discrete data points or horizontal line segments.

DESCRIPTION OF THE PREFERRED EMBODIMENT

Figure 1:
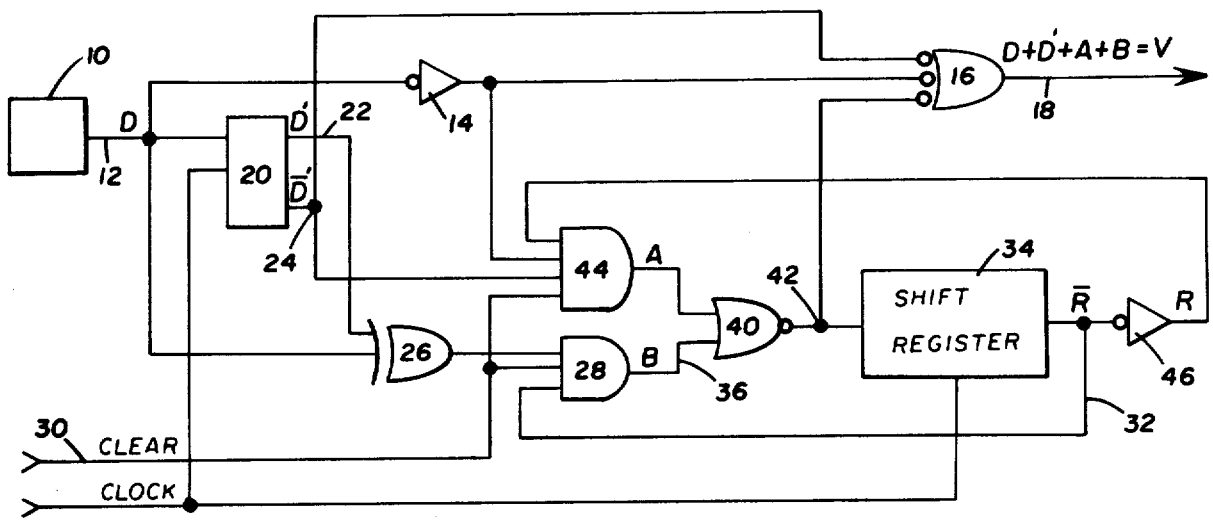
FIG. 1 shows a circuit diagram in accord with the present invention.

The circuit illustrated in FIG. 1 is designed to generate vertical connecting lines between horizontal data lines. In operation, the circuit will determine the beginning and end of the horizontal line of data. Although there are many ways of accomplishing this, the preferred embodiment chooses to do it by delaying the line of data by one clock pulse and comparing the delayed line of data to the actual line of data. It will be seen (note FIG. 3, lines D and D') then that only the position corresponding to the first point of a line of data and the position one clock pulse past the last point of actual data will have a high pulse in one of these two lines and low in the other. By using EXCLUSIVE-OR gate 26, a line of data with high pulses only at the beginning and end of the data line can be generated. This line of data can be stored in a shift register 34 which has the same number of storage positions as positions in the data line.

The determination of the beginning and end of the horizontal line of data is used in subsequent scan lines to generate a vertical line below the beginning and end of the horizontal line or individual data point. In the preferred embodiment, the data stored in the shift register is recirculated, synchronized with the clock pulse, through a recirculating loop in the following scan line. At some point in the recirculating loop there is a connection to the output line to the video display so that the vertical connecting line data generated by the EXCLUSIVE-OR gate can be displayed in the subsequent scan line.

When the vertical connecting line descends to another scan line which has an end of a horizontal line of data or individual point of data that intersects or connects with the vertical connecting line, the connecting line is cut off. Because the preferred embodiment extends each horizontal line or individual data point by one position when it creates the delayed line of data, the vertical connecting line is recirculated until it would overlap an actual data point of a delayed data point. When this coincidence occurs, the two horizontal lines have been connected and data which causes the vertical line is removed from the recirculation path. In the present invention, the recirculating connecting line signal from the shift register is compared with the data and the data delayed by one clock pulse in AND gate 44 to check for this coincidence. If there is a high signal on the data or data delayed by one clock pulse in the same position as a high pulse from the shift register, then the high pulse from the shift register is removed. Thus, the vertical connecting line is terminated.

A further horizontal line of data or data point read into the circuit should not generate a vertical connecting line below one of its end positions if a vertical connecting line has already been generated above it. For example, in FIG. 2 a vertical line below the first data point of line 74 should not be created. That is, the circuit must be able to ascertain whether a data point has already been connected to a data point in a higher scan line or whether a descending vertical must be generated to connect it to a data point in a lower scan line. Although there are many ways which this could be done, the preferred embodiment does this by comparing the data indicative of the beginning and end of a horizontal line of data i.e., the output from the EXCLUSIVE-OR gate, with the contents of the shift register at the corresponding position. If there is already data in the shift register at the position corresponding to an end of a horizontal data line, AND gate 28 blocks the passage of the high pulse indicative of an end of a horizontal data line from the EXCLUSIVE-OR gate 26 to the shift register 32. In this manner, the signal indicative of an end of a horizontal is barred from being placed in storage in shift register 34.

Figure 2:
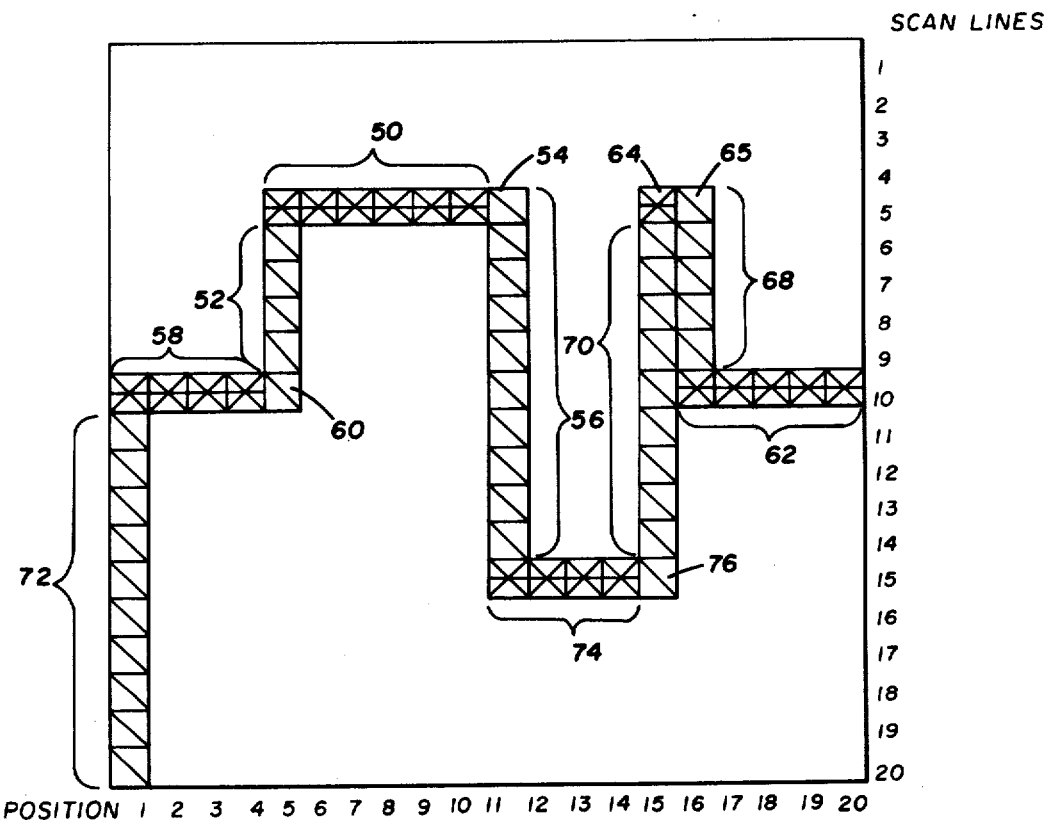
FIG. 2 shows 20×20 display grid in which grids depicting actual data values are marked with a star and grids depicting generated connecting data marked with a slash.

The specific operation of the circuit can best be illustrated by following through the generation of an exemplary visual display. By way of example, the generation of the 20 by 20 display of FIG. 2 is explained below. The grids marked with a star are actual data values stored in memory 10 and the grids marked with a slash are the connecting data generated by the circuit. FIGS. 3 through 8 illustrate the pulse train in various positions in the circuit—line D represents the data from memory 10 on line 12; line D' represents this data delayed by one clock pulse as it would appear on line 22; R represents data stored in the shift register as it would appear emerging from inverter 56; A represents the data emerging from AND gate 44; B represents the data emerging from AND gate 28; and V represents the output on line 18 which connects to the video or other display unit.

Looking to FIG. 1, there is a memory 10 which contains one storage word for each element of resolution along a raster scan line. Each storage word is made up of a sufficient number of bits that each one of the raster scan lines in a frame can be uniquely described. The number of bits per storage word is the power to which 2 must be raised to have a value equal to or greater than the number of scan lines. In the example illustrated in FIG. 2, a 20 by 20 display screen will be demonstrated, i.e., there will be 20 scan lines per frame and 20 elements of resolution per scan line. In this example, there would be 20 storage words, each storage word having five bits of information. If only four bits were used ($2^4 = 16$) all 20 scan lines could not be uniquely indicated because each storage word could only take n on sixteen different magnitudes.

Each of the 20 storage words is addressed, one at a time in sequence with the clock pulses to generate a series of high and low pulses out of memory 10 on line 12 into the data connection circuit. If none of the 20 storage words in the memory has a magnitude corresponding to the first scan line, then a line of 20 low pulses is clocked out on line 12. All values being low, no display will appear on the cathode ray tube.

It will be appreciated that the memory need not be digital. Instead, an analog memory could be used. Then the analog voltage storage corresponding to each position could be addressed one at a time and the voltage at each position compared to a voltage range corresponding to the particular scan line. In a system which has a continuous input for each position, a memory is not even needed. For example, a system with a set of five detectors, which generated an output voltage indicative of a physical property such as thickness of a work piece, could produce a set of analog voltages as long as the work piece remained adjacent the detectors. This removes the need for a memory. To produce a 20 by 20 display from such a system, the analog voltage outputs, whether directly from the detectors or from a memory, would be addressed in order for four consecutive clock pulses a piece to stretch each piece of data to four positions. Each addressed output voltage would be compared with a range of values corresponding to the scan line being generated and if within the range a high output produced. This would produce a display of five horizontal line segments which the present invention would join into a continuous function for easier viewing.

Figure 3:
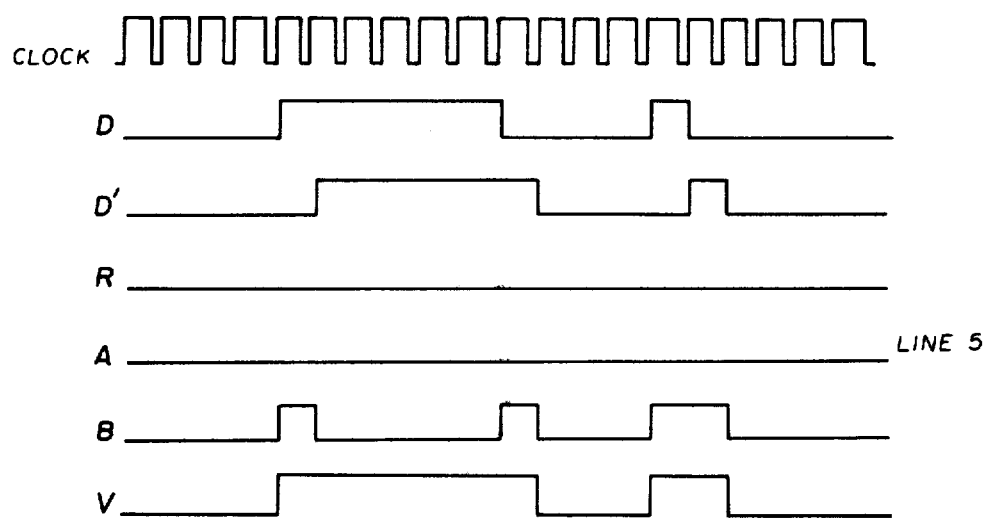
FIGS. 3 through 8 show the pulse trains that would appear at various points in the circuit of FIG. 1 when data corresponding to the fifth, sixth through ninth, tenth, eleventh through fourteenth, fifteenth, and sixteenth through twentieth scan lines, respectively, of FIG. 2 are processed.

In the example of FIG. 2, there will be no data read until the fifth scan line. In the fifth scan line, the fifth, sixth, seventh, eighth, ninth, tenth and fourteenth storage words each have a magnitude corresponding to the fifth scan line, i.e., fifteen lines from the bottom of the screen. Accordingly, the series of clocked high and low pulses on line 12 will appear as four low pulses followed by six high pulses followed by four low pulses, one high pulse and five low pulses as is shown in FIG. 3, line D. This pulse train will be fed into inverter 14 where each high will be turned to a low and low to a high. From its inverter the signals to OR gate 16 which has inverting inputs such that each high will now be turned back to a low and vice versa. An OR gate with inverting inputs in logic is the equivalent of a NAND gate, which is the gate that would normally be used in building the circuit. The output on line 18 to a cathode ray tube will then cause the fifth through tenth and fourteenth phosphor in the fifth scan line to be illuminated.

Further, this train of pulses will be fed to D type flip flop 20. Flip flop 20 has two outputs. The first D' is the same as the input line of pulses except that each pulse is delayed by one clock pulse. That is, instead of the fifth through tenth and fifteenth pulses being high, the sixth through eleventh and sixteenth output pulses from flip flop 22 are high and the rest are low as illustrated in FIG. 3, line D'. Flip flop 20 has a second output 24 which is the inverse of output 22, i.e., each high on 22 is low on 24 and each low on 22 is high on 24.

Output 24 is also fed to a NAND gate 16. This would have the effect, in the example, of creating positive output pulse for phosphors 6 through 11 and 16 as illustrated in FIG. 3, line V. The net effect of this is to extend each data point of data line by one element. The D' or data delayed by one clock pulse signal on line 22 and the data signal from line 12 are both fed to EXCLUSIVE-OR gate 75. EXCLUSIVE-OR gate 26 will produce a high output pulse whenever the pulse from data D is high and the corresponding pulse from data delayed by one clock pulse, D', is low, i.e., at the beginning of a horizontal line of data, or when the pulse on data D is low and the corresponding pulse on data delayed by one clock pulse D' is high, i.e., one clock pulse past the end of a horizontal line of data.

The output of EXCLUSIVE-OR gate 26 goes to AND gate 28 as does a signal on "clear" line 30 which will always be high except at those times when it is desired to clear the data and restart. Also put into AND gate 28 is the signal R inverse on line 32. R inverse is the output of shift register 34. Thus, at each clock pulse there will be an output B on line 36 only if the data and the data delayed by one clock pulse in the corresponding position are one high and one low and when there is no data already present in the shift register at this position. In the example, then, the output B in the fifth line would consist of four low pulses, one high pulse at position 5, low pulses at positions 6 through 10, one high pulse at position 11, low pulses at positions 12 through 14, two high pulses in positions 15 and 16, and low pulses to the end of the scan as is illustrated in FIG. 3, line B. This data B on line 36 is fed into NOR gate 40 which conceptually can be thought of as an OR gate with an inverter on its output. Data on line 42 would be fed into 20 bit shift register 34 where it would be stored in inverse form and to NAND gate 16 which would again produce signals indicating that the phosphor at positions 5, 11, 15 and 16 of the scan line should be illuminated.

Thus, through gates 26, 28 and 40 a signal indicative of the beginning and end of each data point or line of data within a raster scan line are determined and the information stored in shift register 34.

The data in shift register is recirculated so that the data stored in it will be displayed on the next raster scan. The recirculation path is through AND gate 44 which removes data from the recirculation at appropriate times. AND gate 44 has a first input connected to inverter 46 which inverts the output of the shift register 34, i.e., supplies a series of high and low pulses from shift register 34 which were fed into the shift register from NOR gate 40 in the preceding raster scan line. In the present example, the line currently in discussion, line 5, is the first line with data on it. Thus, the shift register had been empty of data until this time so the signal train from the shift register R (more precisely R inverse, inverted) is a series of 20 low pulses. A second input to AND gate 44 is from inverter 14 which supplies the inverse of the data D. A third input is from output 24 of flip flop 20 which supplies the inverse of the data delayed by one clock pulse. The final input to AND gate 44 is from clear line 30 which, as indicated above, during normal operation is always high. The output, A, from AND gate 44 will only be high if R is high and on the corresponding clock pulse there is no data coming in on line 12 nor was there any data preceding clock pulse on line 12. Thus, the data in shift register 34 will continue to be recirculated through AND gate 44, through NOR gate 40, and back into shift register 34 in the same position until there is a high in the string of values D or D' at the corresponding clock pulse. In this manner, a descending display line is terminated when it meets an adjacent data point.

Figure 4:
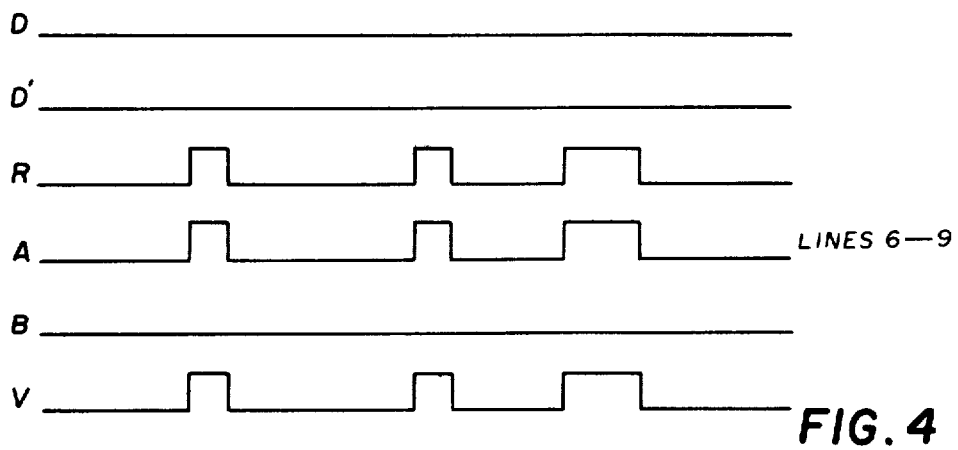

Now going to the sixth line of FIG. 2, it will be seen that none of the 20 storage words in the memory has an output on this raster scan line so that the data train D on line 12 will consist of a string of 20 low pulses as illustrated in FIG. 4, line D. Thus, the line through gates 14 and 16 will produce no highs on line 18. Similarly, the train of pulses from flip flop 20 on data delayed by one clock pulse on line 22 will similarly be a string of 20 zeros as illustrated in FIG. 4, line D', while the inverse of D delayed by one clock pulse on line 24 will be a string of 20 high pulses.

EXCLUSIVE-OR gate 26 will have low pulses applied to both its inputs to all 20 clock pulses of this scan line. Accordingly, its output will be low for the entire scan line as will AND gate 28, see FIG. 4, line B.

It will be remembered that in the preceding line shift register 34 had a data entered into it in the 5th, 11th, 15th and 16th pulse positions. Accordingly, gate 44 will have a string of 20 high pulses applied on its second input, i.e., the inverse of the input data, and on its third input, i.e., the inverse of the input data delayed by one line, but on its first input, it will have a low value from the shift register 34 for the first four values then a high on the 5th, 11th, 15th and 16th clock positions. The output will be the same as this input. The output will be fed through NOR gate 40, which inverts the output, fed onto line 42, see FIG. 4, line A, and both restored in the shift register 34 and fed to NAND gate 16 to produce high output pulses on scan line 18 at the 5th, 11th, 15th and 16th clock pulse positions as illustrated in FIG. 4, line V.

In example of FIG. 2, the same events will occur in scan lines 7, 8 and 9 as in scan line 6.

Figure 5:
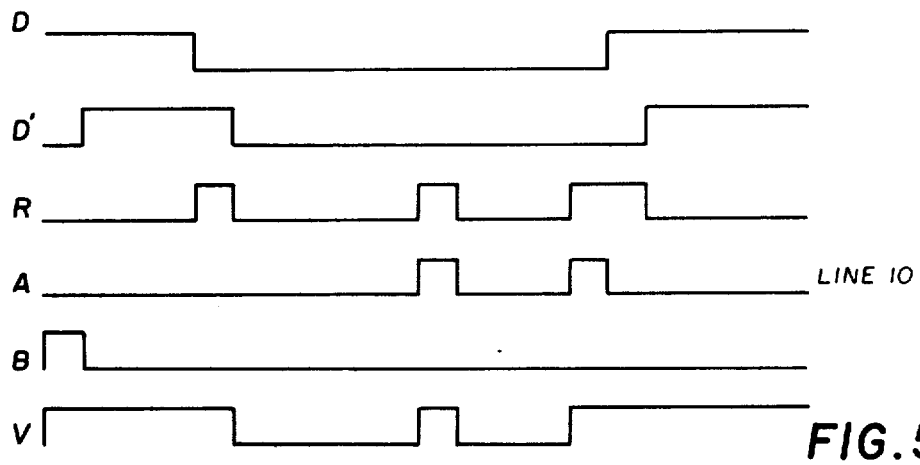
Figure 6:
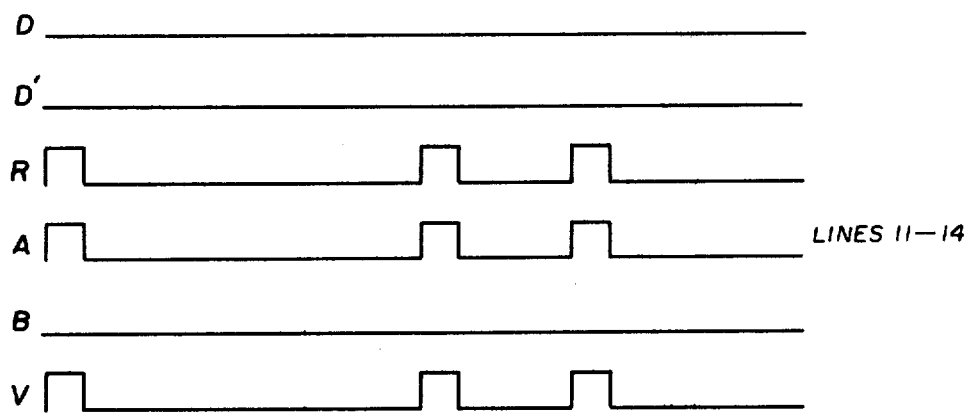
Figure 7:
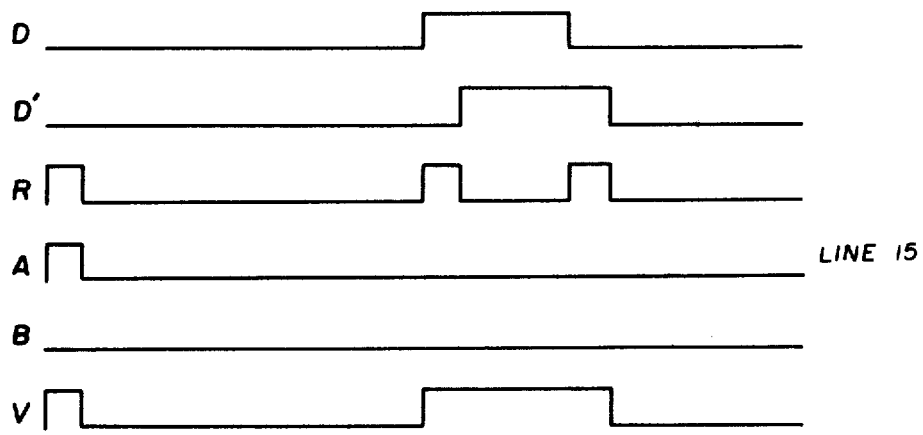
Figure 8:
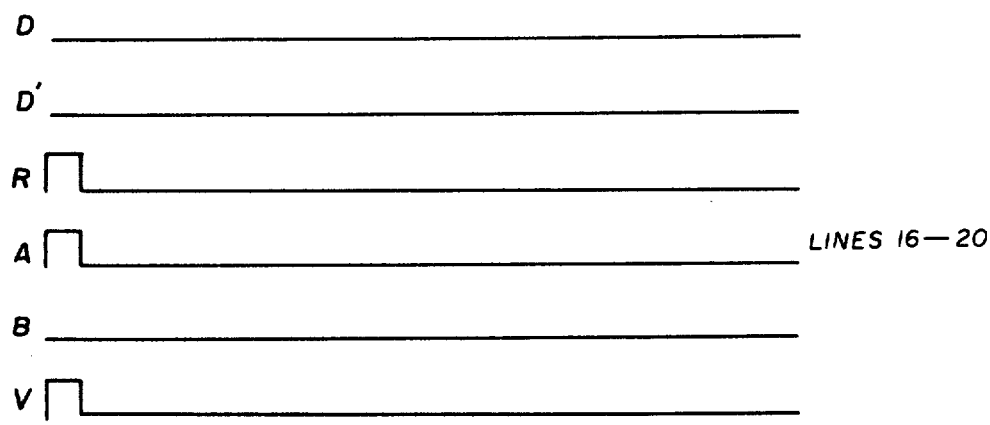

In the tenth line, the data stored in the 20 storage words of memory 10 has a magnitude corresponding to the tenth line in data positions 1, 2, 3 and 4 and 16, 17, 18, 19 and 20 as illustrated in FIG. 5, line D. Thus the line through gates 14 and 16 provide high output signals in these nine clock pulse positions on output line 18. Additionally, the output on 24 of flip flop 20 will cause gate 16 to supply a high output pulse on to the 5th clock pulse position, and were the 21st position not cut off would have supplied an additional high pulse there also.

EXCLUSIVE-OR gate 26 will produce a high output pulse in the 1st, 5th and 16th positions. AND gate 28 receives high inputs from EXCLUSIVE-OR gate 26 only on the 1st, 5th and 16th clock pulse positions. The shift register signal R is high in the 5th and 16th positions from the 9th scan line. Thus R inverse is low in 5th and 16th positions. Accordingly, the only output from AND gate 28 is a high in the 1st clock pulse position with positions 2 through 20 low as illustrated in FIG. 5, line B. Thus, it can be seen that these two additional lines of data points have produced the input to shift register 34 which is required to cause a vertical connecting line in the first element of the scan line only. No other vertical lines will be extending below any of the other data points read in on line 10.

Now looking to the recirculate line AND gate 44 has an input signal R which is high only in positions 5, 11, 15 and 16 as illustrated in FIG. 5, line R. In the 5th position, it will be noticed that data inverse delayed by one clock pulse is low. Accordingly, the vertical line 52 of display points that have been generated by shift register 34 is cut off. Looking to position 11 it will be noted that the data inverse and data delayed by one clock pulse inverse are both high. Accordingly, descending line 56 will be recirculated to the shift register 34 and will be continued in subsequent lines. The same is true for position 15. In position 16, however, data inverse is low. Thus, descending line 68 is also cut off. The composite output of AND gate 44 is illustrated in FIG. 5, line A.

Similarly on scan lines 11, 12, 13 and 14, there will be no data or data delayed by one line. The only output will be from the data recirculating through shift register 34 on the path through AND gate 44 which causes high output pulses on line 18 in positions 1, 11 and 15. Thus causing descending lines 56, 70 and 72 to continue downward. See FIG. 6.

Upon reaching scan line 15, data point 74 is read in from memory 10 in the 11, 12, 13 and 14th positions. See FIG. 7. This data will similarly cause lines 56 and 70 to be terminated. And only the line 72 at the first position will be continued all the way to the bottom of the screen.

Thus, by reading only the twenty data points corresponding to the grids marked with a star, in a memory or other data handling circuit, the circuit of the present invention was able to generate all the connecting data necessary to turn the display into the continuous function of FIG. 2.

Many alternatives immediately suggest themselves. For example, it will be noted that in scan line 16 to the end of the FIG. 2, the circuit with the exception of position 1 is in the same state as at the beginning of the display generation. Thus an additional single valued function could be displayed on the remaining scan lines. If a display of sufficient size were used and the functions to be displayed were not allowed to meet or cross, a plurality of functions could be made continuous and displayed simultaneously. For example, the top half of the display could be a reference function and the lower part one or more test results.

The data coming through EXCLUSIVE-OR gate 26 and AND gate 28 supplies the recirculate data to shift register 34 and also contributes to the output on line 18. However, it will be noticed that this contribution A to the output is always redundant with data from line 24 or on the line through gates 14 and 16. Accordingly, contribution to the output signal from the recirculate line can be taken from between AND gate 44 and NOR gate 40, fed through an inverter, and to NAND gate 16. Another alternative is to sample the recirculated data as it emerges from shift register 34 at line 32. This will cause redundant data at the intersection of a vertical and horizontal line, such as grid point 60 of FIG. 2, however, the output on line 18 will be unchanged. Other changes include replacing NAND gate 16 with an OR gate (without inverting inputs), connecting line 22 rather than 24 to the OR gate, moving inverter 14 to the input of AND gate 44 and connecting the output of AND gate 44 to the third input of the OR gate. There are so many other minor modifications that such would be obvious to the reader which can be made to create redundant data or eliminate redundant data that it is impractical to list them all.

Still other slight modifications can be made which will modify the display so slightly that its utility is not degraded and it still appears as a continuous function. For example, if line 24 were disconnected from NAND gate 16, only shifted data points at the right end of a horizontal line with the vertical connecting line extending from above, such as grid point 60, would be lost. This corner point could be regained by shifting the input to NAND gate 16 from line 42 to line 32 but at the expense of loosing the corner point at the right end of a horizontal line from which point the vertical connecting line extends down such as grid points 54 or 66. Numerous other permutations can be made without departing from the present invention.

The above discussion has been in terms of horizontal lines of data. It will be appreciated that the discussion is just as relevant to individual data points. In working with discrete points of data, the circuit doubles each data point, i.e., puts it on two adjacent horizontal positions and connects subsequent data points with vertical lines. Within the resolution of the display device, this will accurately approximate a curve single valued in the scan direction of virtually any shape. For any wave form single valued in a direction parallel to the scan lines, the present invention generates all the necessary vertical lines to connect discrete data points into a continuous wave form. This invention is applicable to any x,y matrix type display not just cathode ray tubes. The invention is applicable to plasma display panels, all "television" type displays, electrostatic ink or thermal recorders which scan across the paper incrementing scan lines in step with paper motion, and ink jet recorders among others. Further, the present invention is capable of displaying a plurality of non-overlapping single value wave forms on the single cathode ray tube or other x,y type matrix. Under certain conditions, it is possible for the plurality of single value wave forms to touch or cross without disrupting the display, but in most situations touching or crossing would disrupt the display.

Other circuits can be added to remove the vertical line 72 in FIG. 2 or the display means could be adjusted to display only positions 2 to the end, i.e., drop position 1.

The invention is not limited to the specific circuit of FIG. 1 but includes all the alternatives thereto as encompassed within the scope of the claims as follows.

I claim:

1. A system for interpolating data for use in display devices, said system comprising:
    means for receiving a set of data comprising a plurality of scan lines one scan line at a time, wherein each scan line may include one or more lines of data;
    means operatively connected to said receiving means for determining the ends of said lines of data within said scan lines and for producing signals indicative to said ends of said lines of data;
    means operatively connected to the output of said determining means for storing said signals indicative of said ends of said lines of data, wherein the output of said storing means is operatively connected to said determining means to cause said determining means to repeatedly insert in the following scan lines signals indicative of said ends of data from preceding lines of data from preceding scan lines until a subsequent end of data signal is determined in a subsequent scan line;
    means operatively connected to both said receiving means and the output of said determining means for producing an output indicative of both said lines of data received and said inserted signals from said determining means such that at least one of said lines of data within one scan line is connected to at least one of said lines of data within a different scan line; and
    display means connected to said producing means for displaying t1e output of said producing means.

2. The system of claim 1 wherein each line of the lines of data is a train of pulses synchronized with pulses from a clock means.

3. The system of claim 2 wherein each line of data is L clock pulses long, where L is an integer; wherein each set of data is S lines of data where S is an integer; and in combination with a memory means for storing the data set before the data set is received by the receiving means comprising means for storing L storage words, each storage word having N bits where N is a positive integer defined by 2 to the power N is equal to or greater than M.

4. The system of claim 2 wherein said storing means is a shift register and the output of the shift register is a train of pulses synchronized with said clock pulses.

5. The system of claim 2 further including a means for delaying each line of said lines of data received by at least one clock pulse wherein said determining means compares the line of data received with said delayed line of data in order to determine the ends of said line of data received.

6. The system of claim 5, further comprising a gate means operatively connected between the storing means output and the determining means for blocking the ends of data signals from passing from the storing means to said producing means and in turn from passing back to the input of said storing means whenever a new end of data signal is determined in the same position in a subsequent scan line, thus terminating said inserted signals from passing to said producing means.

7. The system of claim 6 wherein said gate means is controlled by at least the delayed line of received data and said line of received data.

8. The system of claim 7 wherein said gate means is further controlled by the coincidence of said line of received data and said delayed line of received data.

* * * * *